United States Patent [19]

Hampl, Jr.

[11] 4,161,111

[45] Jul. 17, 1979

[54] HYDROSTATICALLY EXTRUDED THERMOELECTRIC LEGS

[75] Inventor: Edward F. Hampl, Jr., Saint Paul, Minn.

[73] Assignee: Minnesota Mining and Manufacturing Company, Saint Paul, Minn.

[21] Appl. No.: 876,745

[22] Filed: Feb. 10, 1978

Related U.S. Application Data

[63] Continuation of Ser. No. 804,590, Jun. 8, 1977, abandoned, which is a continuation of Ser. No. 712,680, Aug. 9, 1976, abandoned, which is a continuation of Ser. No. 406,326, Oct. 15, 1973, abandoned, which is a continuation of Ser. No. 156,194, Jun. 24, 1971, abandoned.

[51] Int. Cl.² ............................................. B21D 22/10
[52] U.S. Cl. ..................................................... 72/60
[58] Field of Search ................... 72/60; 264/332, 323, 264/88; 29/420.5

[56] References Cited

U.S. PATENT DOCUMENTS

| | | | |
|---|---|---|---|
| 3,220,199 | 11/1965 | Hanlein et al. | 29/420.5 |
| 3,285,786 | 11/1966 | Katz | 72/258 |
| 3,286,337 | 11/1966 | Suave | 72/60 |
| 3,559,436 | 2/1971 | Nilsson | 29/420.5 |

FOREIGN PATENT DOCUMENTS 260670  5/1970  U.S.S.R. ....................................... 72/60

OTHER PUBLICATIONS

"The Hydrostatic Extrusion of Difficult Metal" by Pugh et al., pp. 201–217, *Institute of Metals*, vol. 93, 3-1965.
"High Pressure Forming" by Kotal, pp. 124–130, *Machine Design*, Jan. 9, 1969.

*Primary Examiner*—Leon Gilden
*Attorney, Agent, or Firm*—Cruzan Alexander; Donald M. Sell; Roger R. Tamte

[57] ABSTRACT

Thermoelectric legs of useful durability may be prepared by hydrostatic extrusion. In cross-section, the legs may have either circular or non-circular shapes of special usefulness, and the legs may be formed in narrow elongated sizes, which are useful in compact, high-voltage thermoelectric converters.

10 Claims, 1 Drawing Figure

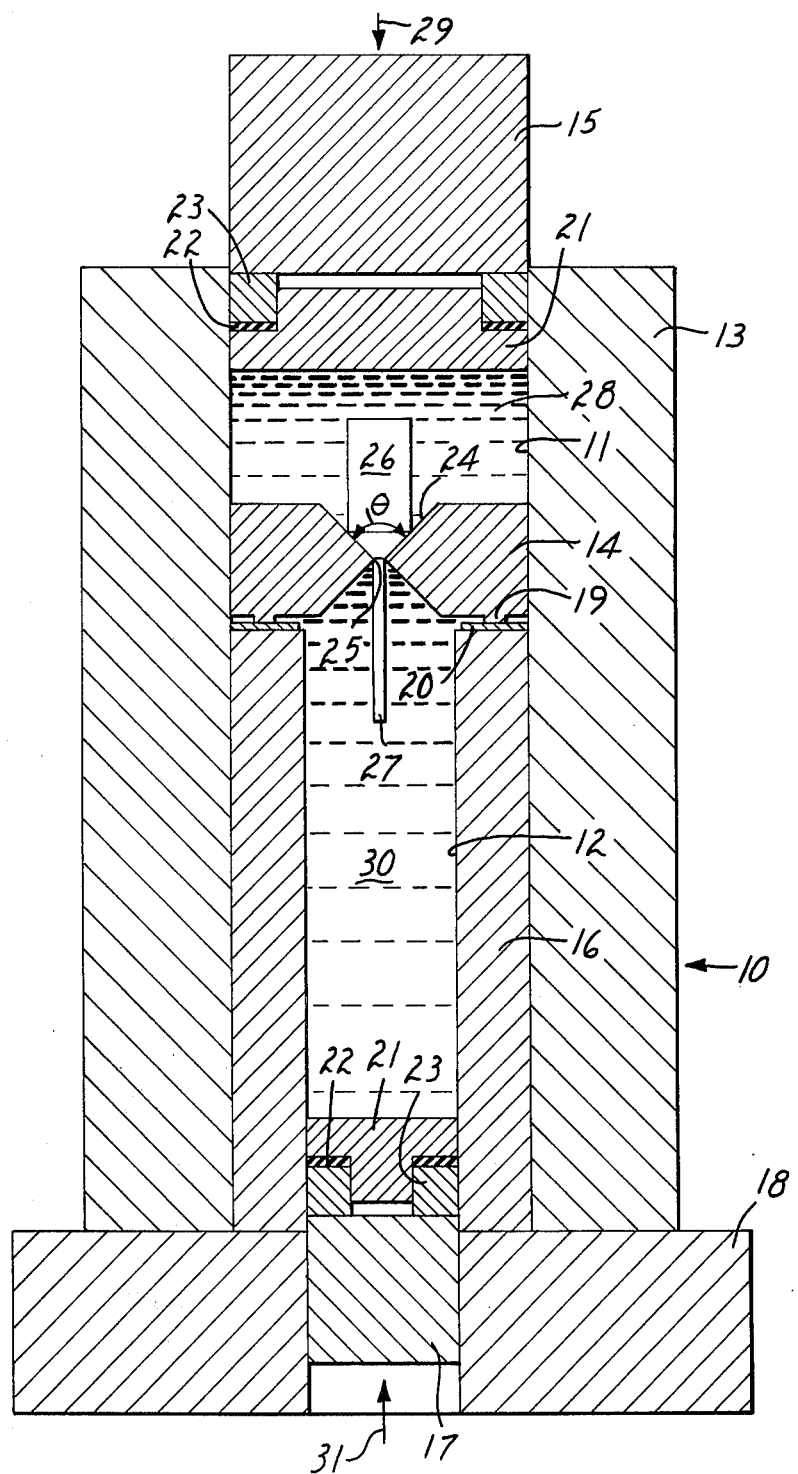

HYDROSTATICALLY EXTRUDED THERMOELECTRIC LEGS

This application is the last of a series of continuation applications, including continuation applications Ser. No. 804,590, filed June 8, 1977; Ser. No. 712,680, filed Aug. 9, 1976; and Ser. No. 406,326, filed Oct. 15, 1973; and parent application Ser. No. 156,194, filed June 24, 1971; all of the previous applications are now abandoned.

Certain thermoelectrically useful materials are difficult to form into thermoelectric legs, especially into narrow elongated legs on the order of 0.1 inch or less in diameter such as are useful in compact, high-voltage, low-power thermoelectric converters. For example, lead telluride thermoelectric legs cast in narrow long sizes may fracture immediately upon removal from the mold, and in any event cannot be handled by conventional procedures and will not have long life in conventional thermopile constructions. Casting of lead telluride has the further disadvantage that ingredients may become segregated in the leg causing the leg to be nonuniform in electrical, thermal, and mechanical properties.

There have been suggestions that thermoelectric legs, including legs of lead telluride, be made by mechanically extruding heated leg material through an orifice; see U.S. Pat. No. 3,220,199. But insofar as known this method has never been commercially practiced and it has several disadvantages and inadequacies. First, surface imperfections are a significant danger with this method, to the degree that the patent proposes extruding the material in an aluminum envelope which is later removed by machining or etching. Further, the passage of thermoelectric material from a heated area to a cooler area, which is inherent in the method as taught in the patent, may result in "zoning" of an impurity promoting agent, or doping agent, in the material; more specifically, the doping agent may move from cooler downstream areas to hotter upstream areas of the extruded leg stock because it is more soluble in the material at higher temperatures, thus lessening control over the concentration of the doping agent over the length of the leg stock. Other important disadvantages of the hot extrusion method are that the leg material may become oxidized or contaminated while heated, for which the patent suggests that the extruded material be enveloped with an inert gas and be extruded through glass dies.

Lead telluride legs are today most often made by powder-pressing techniques, but these techniques have the disadvantages that they introduce undesirable impurities at the grain boundaries and produce low-density legs. Further, powder-pressing techniques are not useful to prepare narrow elongated legs unless the powder is pressed perpendicular to the longitudinal axis of the leg, which is disadvantageous for materials that develop an anisotropic crystal structure during pressing that affects electrical and mechanical properties.

The present invention avoids the above disadvantages through a method in which, briefly, a thermoelectric leg is prepared by extruding a billet of the material of the leg through a die orifice using the pressure of a liquid that surrounds the billet except at the forward end of the billet engaged against the die. Notwithstanding the experience with conventional extrusion techniques, it has been found that thermoelectric legs of good strength and thermoelectric properties are prepared by this hydrostatic extrusion technique. For example, the same N-type lead telluride that readily fractures when cast in narrow elongated sizes may be hydrostatically extruded in those sizes as thermoelectric legs of good toughness and thermoelectric properties. While the reasons for such an improvement are not fully understood, it is believed that energy developed within the material as it is extruded under pressure applied uniformly over a large portion of the billet causes an isotropic atomic rearrangement within the material. Further, avoiding large-area frictional forces on the billet reduces surface faults in the leg that can initiate fracture.

The described working also reduces grain sizes and distributes doping agents uniformly through the leg. Thermoelectric legs of nearly maximum theoretical density are prepared, meaning that electrical resistance is lowered and thermoelectric conversion efficiency is improved. And the legs can be economically prepared in high volume without introducing undesired impurities and while maintaining the level of doping agent within close tolerances.

A further important advantage of the invention is that thermoelectric legs having non-circular cross-sectional shapes can readily be provided. As illustrations, square legs useful in certain thermopile arrangements to increase the packing density of legs in the thermopile, and hollow cylindrical legs useful, for example, to prepare thermocouples of concentric thermoelectric legs (as where an outer tubular leg is used to provide mechanical support for an inner leg) can be prepared by hydrostatic extrusion according to this invention. Conventional techniques for forming thermoelectric legs in such configurations are complicated and not wholly reliable.

DETAILED DESCRIPTION

The drawing shows a cross-section through an illustrative simplified hydrostatic extrusion apparatus 10 useful in the invention. Such an apparatus includes a pressure chamber 11 and a receiver chamber 12, the chamber 11 being defined by a thick-walled outer cylindrical case 13, a die member 14, and a longitudinally movable cylindrical ram 15, and the chamber 12 being defined by a cylindrical sleeve 16, a longitudinally movable cylindrical ram 17, and the die member 14. The cylindrical casing 13 and sleeve 16 are held against a base-frame 18 by means not illustrated. A seal may be provided between the die 14 and sleeve 16 by means of an annular nib 19 and a mica gasket 20. The rams 15 and 17 are also sealed, as by mushroom plugs 21, a rubber gasket 22, and a collar 23. The die member 14 includes a funnel-shaped entry portion 24 and a die orifice 25 and a billet 26 is shown engaged against the die. The billet has been partially extruded through the die orifice 25 to form thermoelectric leg stock 27 as a result of pressure developed on liquid 28 in the pressure chamber 11 by movement of the ram 15 in the direction of the arrow 29.

To obtain the best results, especially with brittle materials, a liquid 30 in the receiver chamber 12 is also under pressure by movement of the ram 17 in the direction of the arrow 31. When such a brittle material, for example, lead telluride, is extruded into a receiver chamber that is filled with a nonpressurized gas or liquid, the extruded material may have structural faults and in extreme cases may even fracture within the receiver chamber. It is preferable that the liquid in the receiver chamber be under a pressure of at least one kilobar and more preferably under a pressure of at least 5 kilobars.

Another preferred condition for practicing this invention is for the die to have an angular edge around the die orifice 25, meaning, as shown in the drawing, that in radial cross-section through the die the edge of the die contacting material passing through the orifice is the apex or point of an angle. When the die has an angular edge around the orifice, pressurized liquid 30 in the receiver chamber 12 surrounds the extruded material immediately as it emerges from the die orifice. If the edge of the die contacting material passing through the orifice has a significant length, such as a quarter of an inch, a brittle extruded material will show structural faults, apparently because the pressure acting on the extruded material is too low. Preferably, the die orifice has a length at least less than 0.1 inch.

Best results are also obtained when material is extruded through the die orifice 25 at a rather slow rate such as 10 inches per hour. If the material is extruded at a fast rate, structural imperfections and surface faults develop in the extruded material. In addition, it is desirable for the liquid to have a higher viscosity than water, such as a mixture of kerosene and motor oil having a viscosity on the order of 50 centipoises. A lubricant such as molybdenum disulfide may be included in the liquid to improve passage of the billet through the die orifice, and the billet is also preferably coated with a lubricant such as an emulsion of polytetrafluoroethylene, which is readily removed after the extrusion operation. The forward end of the billet is generally tapered, with the angle of taper (0 in the drawing) being about 20°–90°, preferably 25°–50°. Passage of material through the die orifice 25 may be further aided by application of heat, as by heating the liquid in the pressure and receiver chambers, preferably to the same temperature in each of the chambers.

The greater the reduction ratio-the ratio of the cross-sectional area of the billet 26 to the cross-sectional area of the die orifice 25-the greater the internal working of the material that will be accomplished, and a greater working is generally associated with improved mechanical properties for the leg. Accordingly, the reduction ratio is preferably at least 10 to 1 though it may be as low as 5 to 1 or even 2 to 1.

The billet may be either cast or powder-pressed material, and the method of this invention will improve densification and homogenization of the material. For example, hydrostatically extruded products prepared from cast and powder-pressed billets of N-type lead telluride showed improvement in densification as follows (the theoretical density of N-type lead telluride is 8.245 gm/cc):

| Sample | Density at Room Temperature (gm/cc) | |
|---|---|---|
| | Billet | Hydrostatic Extruded Leg Stock |
| Cold powder-pressed and sintered N-PbTe | 7.94 | 8.12 |
| Cast N-PbTe | 8.02 | 8.18 |

X-ray examination of extruded material reveals that even when the original billet material has large oriented crystals, the final product has fine-grained crystals with little or no evidence of orientation effects.

The invention is useful to prepare thermoelectric legs in both large and small diameters from generally any thermoelectric material, including N- and P-type lead telluride; lead-germanium telluride; lead-tin tellurides; bismuth-antimony telluride; copper-silver selenides and tellurides; rare-earth selenides and tellurides, such as cerium, erbium, gadolinium, neodymium, and yttrium selenides and tellurides; N- and P-type germanium silicide, and silver-antimony-germanium tellurides. The material can be extruded into long lengths and then sliced to the desired length or if the application so warrants, the product can be curved to a desirable shape. The invention is particularly useful to prepare narrow elongated legs on the order of 0.1 inch or less in diameter and having L/A ratios (ratio of length to cross-sectional area) of 10 or more for use in compact high-voltage thermoelectric converters.

The invention is further illustrated by the following example. Less-iodide-doped N-type lead telluride was hydrostatically extruded in apparatus as illustrated in the drawing from a cast billet 0.25 inch in diameter and 0.75 inch long to leg stock 0.050 inch in diameter, giving a reduction ratio of 25 to 1. The forward end of the billet had a 30° taper, coinciding with the taper of the entry portion of the die. The liquid in the pressure and receiver chambers was a mixture of one volume part kerosene and two parts SAE 30 motor oil, plus a small amount of molybdenum disulfide, with the liquid in the pressure chamber under a pressure of about 10 kilobars and the fluid in the receiver chamber under a pressure of about one kilobar. The billet was coated with a polytetrafluoroethylene emulsion.

The product was crack-free and had a density of 8.17 gms/cc. The room-temperature electrical resistivity was about 340 mn-cm., and curves of Seebeck coefficient versus temperature were improved over the contemporary published data for cold powder-pressed and sintered lead telluride of the same composition.

What is claimed is:

1. A method for preparing thermoelectric legs comprising extruding a billet of thermoelectrically useful material that includes current carriers distributed in the material in an amount that is critical to the thermoelectric utility of the material, the billet being extruded through an orifice in a die by the pressure of a liquid that surrounds the billet except at the forward end of the billet engaged against the die, said material having a higher Seebeck coefficient after extrusion than it had before extrusion.

2. A method of claim 1 in which the extruded material passes into a receiver chamber occupied by a liquid under a pressure of at least one kilobar.

3. A method of claim 1 in which the die has an angular edge around the die orifice.

4. A method of claim 1 in which the ratio of the cross-sectional area of the billet to the cross-sectional area of the die orifice is at least 5 to 1.

5. A method of claim 1 in which the billet is extruded at a rate of less than 10 inches/hour.

6. A method of claim 1 in which the forward end of the billet presented against the die is tapered, with the apex angle of the forward end being between 20° and 90°.

7. A thermoelectric leg prepared by the method of claim 1.

8. Tubular thermoelectric legs prepared by the method of claim 1.

9. A compact high-voltage thermoelectric converter comprising narrow elongated thermoelectric legs prepared by the method of claim 1 and on the order of 0.1 inch or less in diameter and having a ratio of length to cross sectional area of 10 or greater.

10. A method for preparing thermoelectric legs comprising extruding a billet of thermoelectrically useful material that includes current carriers distributed in the material in an amount that is critical to the thermoelectric utility of the material, the billet being extruded through an orifice in a die by the pressure of a liquid that surrounds the billet except at the forward end of the billet engaged against the die, the extruded material passing into a receiver chamber occupied by a liquid under a pressure of at least one kilobar, and the die having an angular edge around the die orifice whereby the pressurized liquid in the receiver chamber acts on the extruded material immediately after it is extruded, said material having a higher Seebeck coefficient after extrusion than it had before extrusion.

* * * * *